United States Patent [19]
Yamaguchi

[11] Patent Number: 5,298,809
[45] Date of Patent: Mar. 29, 1994

[54] BALANCED TYPE DIFFERENTIAL INTEGRATING CIRCUIT

[75] Inventor: Hiroshi Yamaguchi, Ikoma, Japan

[73] Assignee: Sharp Kabushiki Kaisha, Osaka, Japan

[21] Appl. No.: 855,674

[22] Filed: Mar. 23, 1992

[30] Foreign Application Priority Data

Jul. 1, 1991 [JP] Japan .................. 3-160502

[51] Int. Cl.$^5$ .................. G06G 7/10; H03K 5/22
[52] U.S. Cl. .................. 307/491; 307/355; 307/546; 307/296.4; 330/258
[58] Field of Search ............ 307/355, 491, 546, 296.4; 330/258

[56] References Cited

U.S. PATENT DOCUMENTS

| | | | |
|---|---|---|---|
| 3,786,362 | 1/1974 | Marsh et al. | 330/258 |
| 4,616,189 | 10/1986 | Pengue, Jr. | 330/258 |
| 4,701,719 | 10/1987 | Nagata | 330/258 |
| 4,742,308 | 5/1988 | Banu | 330/258 |
| 4,752,744 | 6/1988 | Aoki | 330/258 |
| 4,835,488 | 5/1989 | Garuts | 330/258 |
| 4,901,030 | 2/1990 | Webster | 330/258 |
| 5,180,932 | 1/1993 | Bengel | 307/491 |

FOREIGN PATENT DOCUMENTS 0168410 12/1981 Japan .................. 330/258

Primary Examiner—Margaret R. Wambach

[57] ABSTRACT

A balanced type differential amplifier circuit including a mutual-conductance differential amplifier circuit having two differential output terminals, a constant-current circuit for supplying an operating current to the mutual-conductance differential amplifier circuit, two resistors connected in series across the two differential output terminals in order to detect an in-phase component of output voltages of the two differential output terminals, and a circuit for adjusting a value of the operating current supplied by the constant-current circuit according to the value of the detected in-phase component.

6 Claims, 5 Drawing Sheets

BALANCED TYPE DIFFERENTIAL INTEGRATING CIRCUIT

BACKGROUND OF THE INVENTION

1. Field of the Invention

This invention relates to a differential amplifier circuit.

2. Description of the Background Art

FIG. 5 shows a single output type mutual-conductance differential amplifier circuit (hereafter referred to as a gm amplifier circuit). In FIG. 5, the emitters of transistors Q21 and Q22 are connected to a constant-current circuit I21, and their collectors are connected to a current mirror circuit constituted by transistors Q23 and Q24 and resistances R21 and R22. IN0 and IN1 are input terminals of the gm amplifier circuit, and are connected to the bases of the transistors Q22 and Q21 respectively. On the other hand, OUTA is a current output terminal, and is connected to the collector of the transistor Q22. A capacitor C21 is a load capacity of the gm amplifier circuit, and converts a current signal from the OUTA into a voltage signal. A buffer B21, and outputs at a low impedance a voltage signal from C21 through an output terminal OUT to the outside. FIG. 6 is a symbolic representation of the circuit of FIG. 5.

FIG. 7 is an example of an active filter circuit constituted by the gm amplifier circuit as shown in FIG. 6 (or FIG. 5), and this circuit operates as a primary low-pass filter.

An active filter circuit using a conventional single-output gm amplifier circuit, such as this, tends to allow noise to be mixed in the signal when the supply voltage fluctuates. That is to say, the supply voltage fluctuation removal ratio is insufficient, which is a problem.

SUMMARY OF THE INVENTION

Therefore, an object of the present invention is to provide a balanced type differential amplifier circuit which solves the above problem and which realizes a filter circuit of superior supply voltage fluctuation removal ratio.

In order to achieve the above object, the balanced type differential amplifier circuit according to the present invention comprises a mutual-conductance differential amplifier circuit having two differential output terminals; a constant-current circuit for supplying an operating current to the mutual-conductance differential amplifier circuit; a detector for detecting an in-phase component of output voltages of the two differential output terminals; and an adjustment circuit for adjusting a value of the operating current supplied by the constant-current circuit according to the in-phase component detected.

In the balanced type differential amplifier circuit according to the present invention, the adjustment circuit decreases a constant-current value of the active load when the constant-current value of an active load increases and the level of the in-phase component of the signals outputted from the differential voltage output terminals increases. In this manner, by feedback of the in-phase component of the output signals, the in-phase component of the output signals can be maintained at a substantially constant level. Therefore, a balanced type differential amplifier circuit can be realized easily which is stable in the level of the in-phase component of the output signals, so that a filter circuit of superior supply voltage fluctuation removal ratio can be realized, which filter circuit can handle both the input and output signals as differential signals.

By using this balanced type differential amplifier circuit according to the present invention, it is possible to realize a balanced type differential gm amplifier stabilized in the level of the in-phase component of the output signals, so that it is possible to realize an active filter which is capable of handling input and output signals as differential signals and which has improved supply voltage fluctuation removal ratio.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Further objects and advantages of the present invention will be apparent from the following description, reference being made to the accompanying drawings which are given by way of illustration only and thus are not limitative of the present invention and wherein.

PREFERRED EMBODIMENTS OF THE INVENTION

Figure 1:
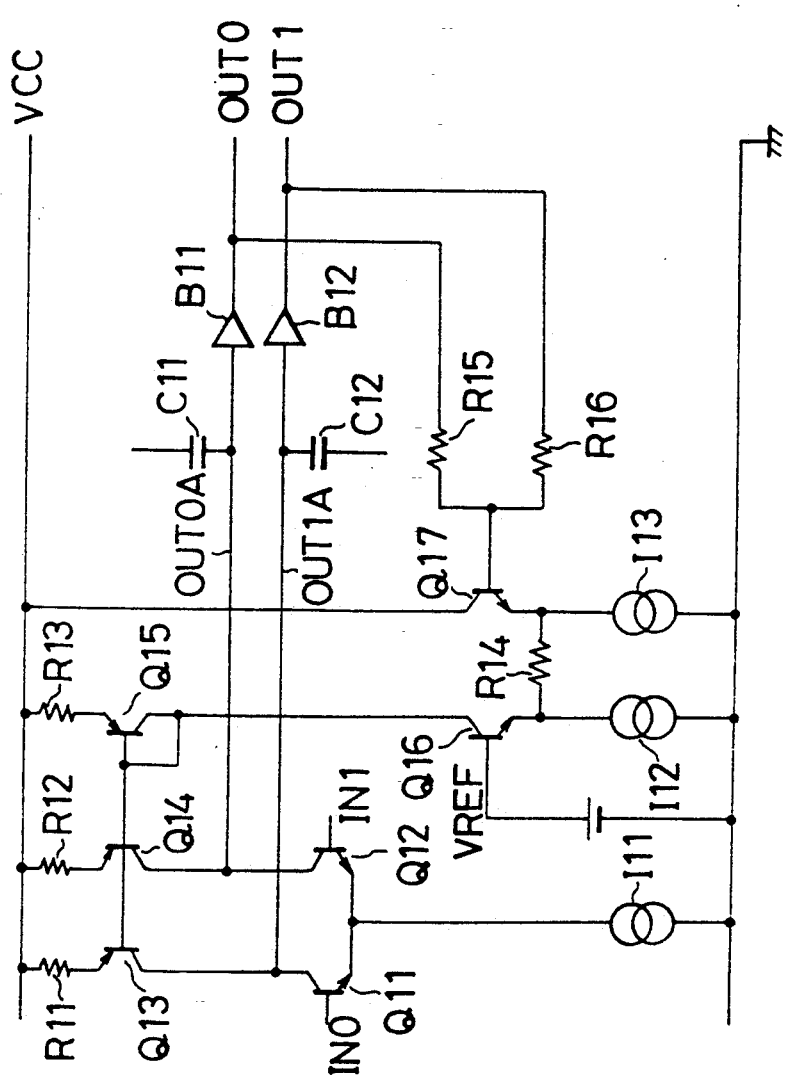
FIG. 1 is a circuit diagram showing an embodiment of a balanced type differential gm amplifier circuit according to the present invention.

Preferred embodiments of the present invention will now be described with reference to the drawings. FIG. 1 shows an embodiment of a balanced type differential gm amplifier circuit according to the present invention. In FIG. 1, the emitters of transistors Q11 and Q12 are connected to one end of a constant-current circuit I11, and the other end of the constant-current circuit I11 is grounded. The collectors of the transistors Q11 and Q12 are connected to the collectors of transistors Q13 and Q14, respectively. The transistors Q13 to Q15 constitute a current mirror circuit, the bases of those transistors and the collector of the transistor Q15 are all connected in common, and the emitters of the transistors Q13 to Q15 are connected to a power supply VCC through resistors R11, R12 and R13, respectively. The bases of the transistors Q11 and Q12 are connected respectively to input terminals IN0 and IN1 of the balanced type differential gm amplifier circuit. The collectors of the transistors Q11 and Q12 are connected respectively to differential current output terminals OUT1A and OUT0A. C11 and C12 are load capacitors of the balanced type differential gm amplifier circuit, and convert current signals supplied through the differential current output terminals OUT0A and OUT1A into voltage signals. B11 and B12 are buffers, whose inputs are connected respectively to the differential current output terminals OUT0A and OUT1A, and whose outputs are connected respectively to voltage output terminals OUT0 and OUT1 of the balanced type differential gm amplifier circuit. Resistors R15 and R16 are used to detect the in-phase component of the output signals of the buffers B11 and B12, and their resistance values are the same. The resistors R15 and R16 are connected at each one end to the outputs of the buffers B11 and B12, and their other ends are both connected to the base of a transistor Q17.

The emitters of a transistor Q16 and the Q17 are connected respectively to each one end of constant-current circuits I12 and I13, and connected to each other through a resistor R14. The other ends of the constant-current circuits I12 and I13 are grounded. The collector of the transistor Q17 is connected to the power supply VCC, while the collector of the transistor Q16 is connected to the collector of the transistor Q15. A reference voltage VREF is applied to the base of the transistor Q16. The transistors Q16 and Q17, the constant-current circuits I12 and I13 and resistors R15 and R16 constitute a negative-feedback circuit for feeding the in-phase component of the signals outputted from the output terminals OUT0 and OUT1 back to the collector currents of the transistors Q13 and Q14.

Description will now be made of the operation of the gm amplifier circuit mentioned above. Signals supplied to the input terminals IN0 and IN1 are amplified by the transistors Q11 and Q12, and outputted as current signals from the differential current output terminals OUT0A and OUT1A. The loads C11 and C12 convert the current signals into voltage signals. The buffers B11 and B12 receive the voltage signals from the loads C11 and C12, and output the voltage signals at low impedance from the voltage output terminals OUT0 and OUT1. In the above-mentioned balanced type differential gm amplifier circuit, the input and output signals are deemed as differential signals.

The voltage of the in-phase component of the signals outputted from the buffers B11 and B12 is detected by the resistors R15 and R16, and applied to the base of the transistor Q17. For example, when the power supply voltage rises and the voltage of the in-phase component become higher than the reference voltage VREF, the collector current of the transistor Q16 decreases. Therefore, the collector currents of the transistors Q13 and Q14 decrease, too, so that the in-phase component of the signals supplied from the buffers B11 and B12 decrease.

Figure 2:
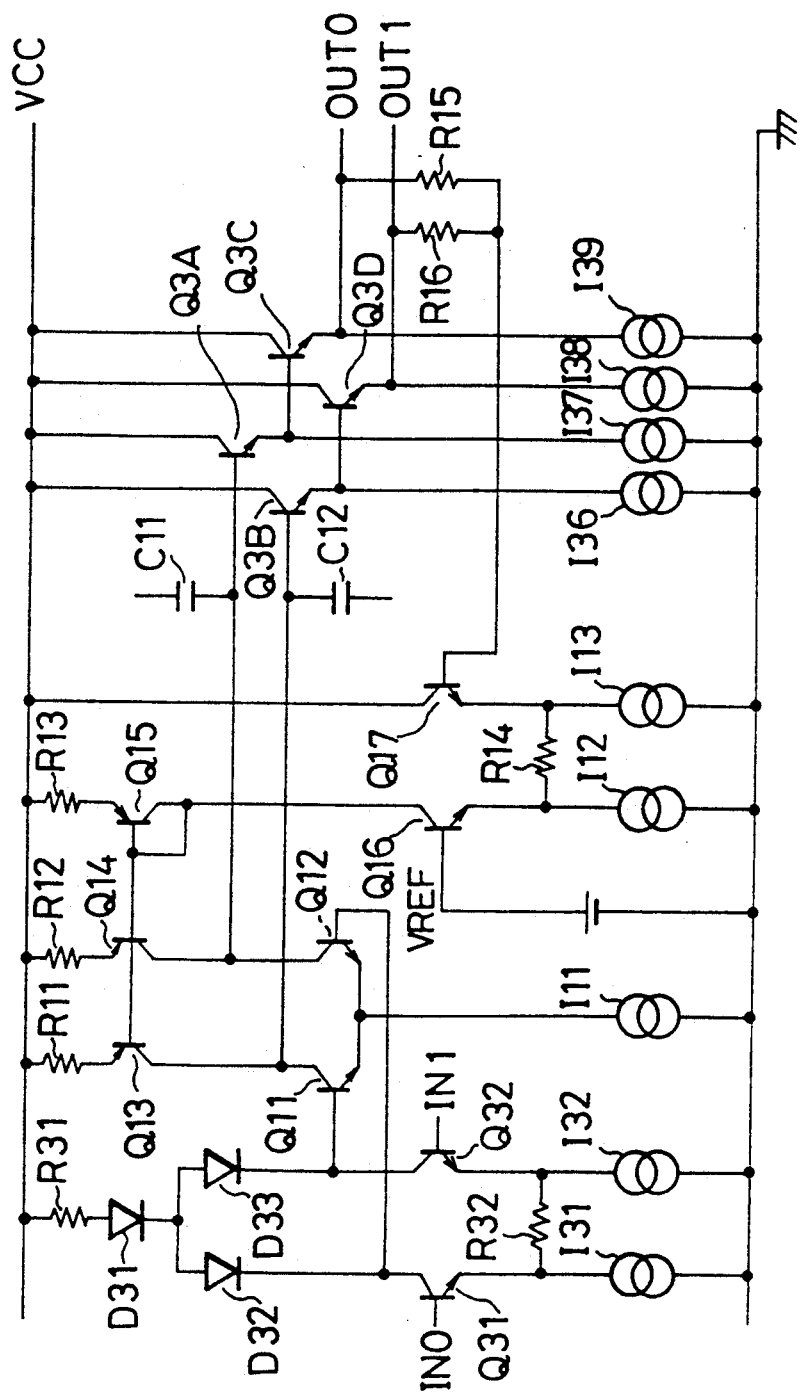
FIG. 2 is a circuit diagram showing another embodiment of the balanced type differential gm amplifier circuit according to the present invention.

FIG. 2 shows another embodiment of the balanced type differential gm amplifier circuit according to the present invention. This circuit differs from the circuit of FIG. 1 in that a current multiplier circuit is added at the previous stage, and that the buffers B11 and B12 are constituted by two stages of emitter followers.

To be more specific, transistors Q31 and Q32 constitute a current multiplier circuit, their emitters are connected to each one end of constant-current circuits I31 and I32, and further connected to each other through a resistor R32. The other ends of the constant-current circuits I31 and I32 are grounded. The collectors of the transistors Q31 and Q32 are connected to the cathodes of diodes D32 and D33, and the anodes of the diodes D32 and D33 are respectively connected through a diode D31 and a resistor R31 to the power supply VCC. The collectors of the transistors Q31 and Q32 are connected respectively to the bases of the transistors Q12 and Q11. The bases of the transistors Q31 and Q32 serve as the input terminals IN0 and IN1 of the balanced type differential gm amplifier circuit.

Transistors Q3A and Q3C constitute a buffer for receiving a voltage signal from the load capacitor C11 and outputting the voltage signal at a low impedance from an output terminal OUT0. The base of the transistor Q3A is connected to the collector of the transistor Q12, the emitter of the transistor Q3A is connected to one end of a constant-current circuit I37 and the base of the transistor Q3C. The collector of the transistor Q3A is connected to the power supply VCC. The emitter of the transistor Q3C is connected to one end of a constant-current circuit I39 and also to the output terminal OUT0, the collector of the transistor Q3C is connected to the power supply VCC. The other ends of the constant-current circuits I37 and I39 are both grounded. On the other hand, transistors Q3B and Q3D constitute a buffer for receiving a voltage signal from the load capacitor C12 and outputting the voltage signal at a low impedance from the output terminal OUT1. The base of transistor Q3B is connected to the collector of the transistor Q11, the emitter of the transistor Q3B is connected to one end of a constant-current circuit I36 and also to the base of the transistor transistor Q3D, and the collector of the Q3B is connected to the power supply VCC. The emitter of the transistor Q3D is connected to one end of a constant-current circuit I38 and also to the output terminal OUT1, and the collector of the transistor Q3D is connected to the power supply VCC. The other ends of the constant-current circuits I36 and I38 are both grounded.

Figure 3:
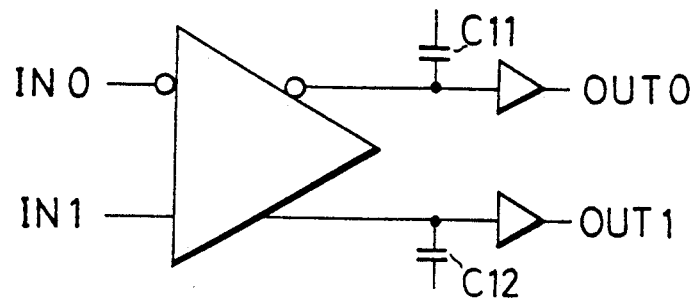
FIG. 3 is a circuit diagram showing the circuit of FIG. 2 in simplified form.

Also in this balanced type differential gm amplifier circuit, like in the circuit of FIG. 1, the input and output signals are deemed as differential signals. Added with the current multiplier circuit formed by the transistors Q31 and Q32, this circuit can further reduce the mutual conductance. FIG. 3 is a symbolic representation of the circuit of FIG. 2.

Figure 4:
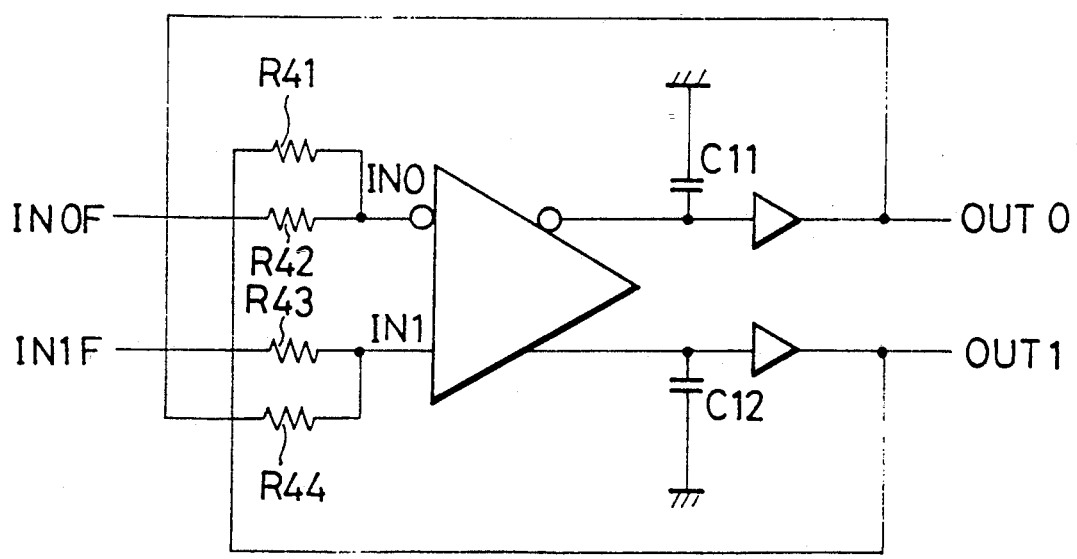
FIG. 4 is a circuit diagram showing a primary low-pass filter circuit constituted by the circuit of FIG. 3.
Figure 5:
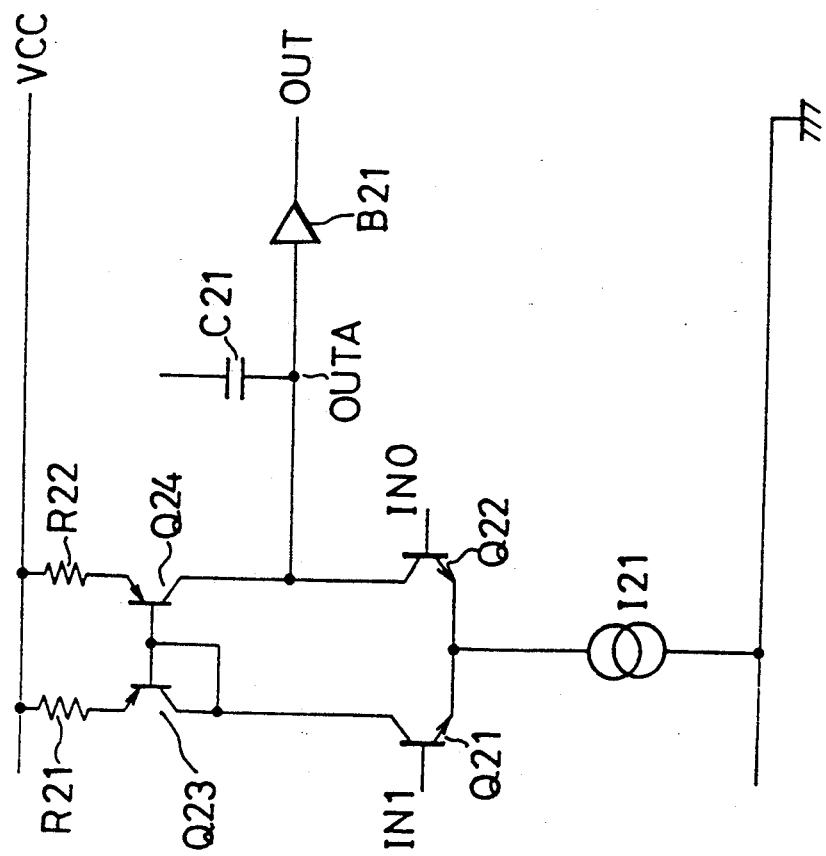
FIG. 5 is a circuit diagram showing an example of a conventional single-output gm amplifier circuit.
Figure 6:
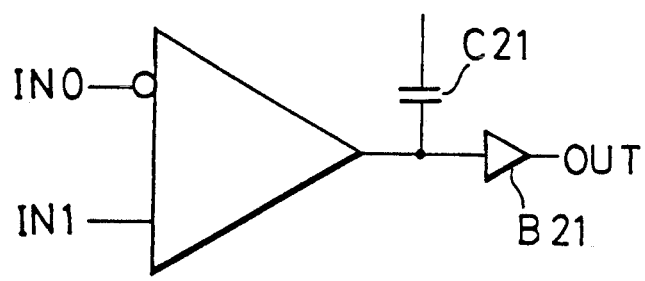
FIG. 6 is a circuit diagram showing the circuit of FIG. 5 in simplified form.
Figure 7:
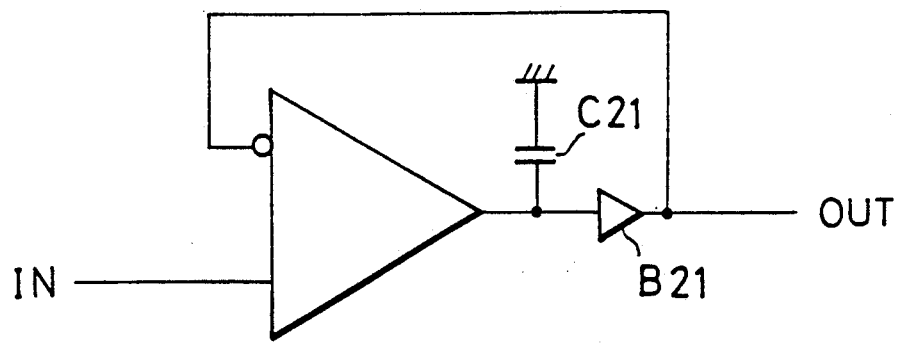
FIG. 7 is a circuit diagram showing a primary low-pass filter circuit constituted by the circuit of FIG. 6.

FIG. 4 shows an active filter circuit which operates as a primary low-pass filter constituted by the balanced type differential gm amplifier circuit of FIG. 3. The values of resistors R41 to R44 are the same, and constitute an adder circuit. The resistors R42 and R43 are connected between input terminals IN0, IN1 and the input terminals IN0F, IN1F of the filter circuit, and the resistors R44 and R41 are connected between the output terminals OUT0, OUT1 and the input terminals IN1, IN0, thereby providing a negative feed back. Unlike the conventional filter circuit of FIG. 7, this filter circuit handles the input and output signals as differential signals, so that the signals are least likely to be mixed with noise caused by fluctuations in the power supply voltage, making it possible to obtain an excellent power supply voltage fluctuation removal ratio.

The filter of FIG. 4 is constituted by the balanced type differential gm amplifier circuit of FIG. 2. However, it can be constituted by the balanced type differential gm amplifier circuit of FIG. 1 and the same effects can be obtained.

Many widely different embodiments of the present invention may be constructed without departing from the spirit and scope of the present invention. It should be understood that the present invention is not limited to the specific embodiments described in this specification, except as defined in the appended claims.

What is claimed is:

1. A differential integrating circuit comprising:
   a mutual-conductance differential amplifier circuit having two differential output terminals;
   first and second capacitors, respectively coupled to outputs of said mutual-conductance differential amplifier circuit, for converting the outputs into integral outputs;
   first and second buffers, respectively coupled to said first and second capacitors, for converting said integral outputs into respective voltage signals;
   a constant-current circuit for supplying an operating current to said mutual-conductance differential amplifier circuit;
   means for detecting an in-phase component of said voltage signals; and
   means for adjusting a value of the operating current supplied by said constant-current circuit according to a value of the in-phase component detected.

2. The differential integrating circuit according to claim 1, wherein said means for detecting the in-phase component comprises first and second resistors respectively connected in series with said first and second buffers.

3. The differential integrating circuit according to claim 2, wherein a voltage of a node of said first and second resistors is supplied as the in-phase component to said means for adjusting the value of the operating current.

4. The differential integrating circuit according to claim 1, wherein said two differential output terminals are differential current output terminals.

5. The differential integrating circuit according to claim 1, wherein said mutual-conductance differential amplifier circuit comprises:
   a current-multiplier circuit for inputting input signals to the differential integrating circuit and for outputting the outputs of said mutual-conductance difference amplifier circuit.

6. The differential integrating circuit according to claim 5, wherein said current-multiplier circuit comprises:
   a constant-voltage circuit for supplying an operating voltage of said current-multiplier circuit; and
   a constant-current circuit for supplying an operating current of said current-multiplier circuit.

* * * * *